(12) United States Patent
Ausserlechner

(10) Patent No.: US 8,680,843 B2
(45) Date of Patent: Mar. 25, 2014

(54) MAGNETIC FIELD CURRENT SENSORS

(75) Inventor: Udo Ausserlechner, Villach (AT)

(73) Assignee: Infineon Technologies AG, Neubiberg (DE)

(*) Notice: Subject to any disclaimer, the term of this patent is extended or adjusted under 35 U.S.C. 154(b) by 565 days.

(21) Appl. No.: 12/813,218

(22) Filed: Jun. 10, 2010

(65) Prior Publication Data
US 2011/0304327 A1 Dec. 15, 2011

(51) Int. Cl.
G01R 1/20 (2006.01)

(52) U.S. Cl.
USPC .......... 324/126; 324/762.01; 324/117 H; 324/239; 324/76.11; 324/144; 324/260; 361/63; 361/64; 361/65; 361/66; 361/88; 361/93.1; 361/93.6

(58) Field of Classification Search
USPC ......... 324/762.01, 117 H, 239, 76.11, 144, 324/260, 126; 361/63–66, 88, 93.1, 93.6
See application file for complete search history.

(56) References Cited

U.S. PATENT DOCUMENTS

| | | | |
|---|---|---|---|
| 3,323,057 A | 5/1967 | Mary | |
| 4,559,495 A | 12/1985 | Lienhard | |
| 4,894,610 A | 1/1990 | Friedl | |
| 5,017,804 A | 5/1991 | Harnden | |
| 5,041,780 A | 8/1991 | Rippel | |
| 5,173,758 A | 12/1992 | Heremans | |
| 5,642,041 A | 6/1997 | Berkcan | |
| 5,786,976 A | 7/1998 | Field | |
| 5,963,028 A | 10/1999 | Engel | |
| 6,310,470 B1 | 10/2001 | Hebing | |
| 6,341,416 B1 | 1/2002 | Biskeborn | |
| 6,356,068 B1 | 3/2002 | Steiner | |
| 6,424,018 B1 | 7/2002 | Ohtsuka | |
| 6,452,413 B1* | 9/2002 | Burghartz | 324/117 H |
| 6,462,531 B1 | 10/2002 | Ohtsuka | |
| 6,512,359 B1 | 1/2003 | Tamai et al. | |

(Continued)

FOREIGN PATENT DOCUMENTS

DE 19821492 11/1999
DE 10233129 A1 2/2003

(Continued)

OTHER PUBLICATIONS

Allegro, Allego Hall Effect-Based Current Sensor ICs: Revolutionary, high accuracy, high bandwidth current sensing!, www.allegomicro.com/en/Products/Design/curren_sensors/index.asp, 5 pages, © 2010.

(Continued)

Primary Examiner — Arleen M Vazquez
Assistant Examiner — Lamarr Brown
(74) Attorney, Agent, or Firm — Patterson Thuente Pedersen, P.A.

(57) ABSTRACT

Magnetic field current sensing devices, systems and methods are disclosed. In an embodiment, a current sensor includes a semiconductor die; an isolation layer disposed on the semiconductor die; at least one anchor pad disposed on the isolation layer; a current input and a current output galvanically isolated from the semiconductor die; at least one bond wire coupled to the current input and the current output, a longitudinal portion of the at least one bond wire disposed between the current input and the current output being stitched to the at least one anchor pad; and at least one sensor element arranged to sense a magnetic field induced by a current flowing in the at least one bond wire.

31 Claims, 14 Drawing Sheets

(56) References Cited

U.S. PATENT DOCUMENTS

| | | | |
|---|---|---|---|
| 6,636,029 B1 | 10/2003 | Kunze | |
| 6,683,448 B1 | 1/2004 | Ohtsuka | |
| 6,727,683 B2 | 4/2004 | Goto | |
| 6,781,313 B2 | 8/2004 | Aiken | |
| 6,841,989 B2 | 1/2005 | Goto | |
| 6,940,265 B2 | 9/2005 | Hauenstein | |
| 6,949,927 B2 | 9/2005 | Goetz | |
| 6,995,315 B2 | 2/2006 | Sharma | |
| 7,075,287 B1 | 7/2006 | Mangtani | |
| 7,129,691 B2 | 10/2006 | Shibahara | |
| 7,166,807 B2 | 1/2007 | Gagnon | |
| 7,259,545 B2 | 8/2007 | Stauth | |
| 7,358,724 B2* | 4/2008 | Taylor et al. | 324/260 |
| 7,375,507 B2 | 5/2008 | Racz | |
| 7,474,093 B2 | 1/2009 | Ausserlechner | |
| 7,476,816 B2 | 1/2009 | Doogue | |
| 7,476,953 B2 | 1/2009 | Taylor | |
| 7,492,178 B2 | 2/2009 | Bidenbach | |
| 7,528,593 B2* | 5/2009 | Tanizawa | 324/117 H |
| 7,545,136 B2* | 6/2009 | Racz et al. | 324/117 H |
| 7,564,239 B2* | 7/2009 | Mapps et al. | 324/260 |
| 7,605,580 B2* | 10/2009 | Strzalkowski | 324/117 H |
| 7,709,754 B2* | 5/2010 | Doogue et al. | 174/528 |
| 7,746,056 B2* | 6/2010 | Stauth et al. | 324/117 R |
| 7,816,905 B2* | 10/2010 | Doogue et al. | 324/117 H |
| 7,923,987 B2* | 4/2011 | Ausserlechner | 324/126 |
| 8,159,254 B2 | 4/2012 | Kaltalioglu | |
| 8,217,643 B2 | 7/2012 | Kuroki et al. | |
| 8,283,742 B2 | 10/2012 | Motz | |
| 2001/0052780 A1 | 12/2001 | Hayat-Dawoodi | |
| 2003/0155905 A1 | 8/2003 | Hauenstein | |
| 2005/0270013 A1* | 12/2005 | Berkcan et al. | 324/126 |
| 2005/0270014 A1* | 12/2005 | Zribi et al. | 324/126 |
| 2006/0076947 A1* | 4/2006 | Berkcan et al. | 324/126 |
| 2006/0255797 A1* | 11/2006 | Taylor et al. | 324/262 |
| 2006/0284613 A1* | 12/2006 | Hastings et al. | 324/117 H |
| 2007/0063690 A1 | 3/2007 | De Wilde | |
| 2008/0035923 A1 | 2/2008 | Tschmelitsch | |
| 2008/0297138 A1* | 12/2008 | Taylor et al. | 324/117 H |
| 2008/0312854 A1* | 12/2008 | Chemin et al. | 702/64 |
| 2009/0026560 A1 | 1/2009 | Wombacher | |
| 2009/0050990 A1 | 2/2009 | Aono | |
| 2009/0058412 A1 | 3/2009 | Taylor | |
| 2009/0128130 A1* | 5/2009 | Stauth et al. | 324/117 R |
| 2009/0152595 A1* | 6/2009 | Kaga et al. | 257/208 |
| 2009/0184704 A1 | 7/2009 | Guo | |
| 2009/0294882 A1 | 12/2009 | Sterling | |
| 2009/0295368 A1* | 12/2009 | Doogue et al. | 324/117 H |
| 2009/0322325 A1* | 12/2009 | Ausserlechner | 324/260 |
| 2010/0045285 A1* | 2/2010 | Ohmori et al. | 324/260 |
| 2010/0045286 A1* | 2/2010 | Hotz et al. | 324/260 |
| 2010/0117638 A1* | 5/2010 | Yamashita et al. | 324/233 |
| 2010/0156394 A1* | 6/2010 | Ausserlechner et al. | 324/144 |
| 2010/0231198 A1* | 9/2010 | Bose et al. | 324/117 H |
| 2010/0237853 A1* | 9/2010 | Bose et al. | 324/117 H |
| 2011/0133732 A1 | 6/2011 | Sauber | |
| 2011/0172938 A1* | 7/2011 | Gu et al. | 702/62 |
| 2011/0204887 A1 | 8/2011 | Ausserlechner | |
| 2011/0234215 A1 | 9/2011 | Ausserlechner | |
| 2011/0248711 A1 | 10/2011 | Ausserlechner | |
| 2011/0298454 A1* | 12/2011 | Ausserlechner | 324/252 |
| 2011/0304327 A1 | 12/2011 | Ausserlechner | |
| 2012/0049884 A1 | 3/2012 | Kaltalioglu | |
| 2012/0112365 A1 | 5/2012 | Ausserlechner | |
| 2012/0146164 A1* | 6/2012 | Ausserlechner | 257/421 |
| 2012/0146165 A1 | 6/2012 | Ausserlechner | |
| 2012/0262152 A1* | 10/2012 | Ausserlechner | 324/117 R |

FOREIGN PATENT DOCUMENTS

| | | |
|---|---|---|
| DE | 10231194 | 2/2004 |
| DE | 19946935 | 2/2004 |
| DE | 60 2005 003 777 | 12/2008 |
| WO | WO 01/23899 A1 | 4/2001 |
| WO | WO 2005/033718 A1 | 4/2005 |
| WO | WO 2008/008140 | 1/2008 |
| WO | WO 2009/088767 | 9/2009 |

OTHER PUBLICATIONS

Allegro, *Hall-Effect Sensor IC's: Current Sensor ICs*, 1 page, © 2010.

Allegro, High Bandwidth, Fast Fault Response Current Sensor IC In Thermally Enhanced Package, ACS709-DS, www.microallegro.com, 16 pages, © 2008-2009.

Allegro, *Fully Integrated, Hall Effect-Based Linear Current Sensor IC with 2.1 kVRMS Isolation and a Low-Resistance Current Conductor*, ACS712-DS, Rev. 13, 14 pages, © 2006-2010.

Sandireddy, Sandhya, *IEEE Xplore*, © 2005, *Advanced Wafer Thinning Technologies to Enable Multichip Packages*, pp. 24-27.

Hopkins, Allegro MicroSystems, Inc., High-Performance Power ICs and Hall-Effect Sensors, "Hall Effect Technology for Server, Backplane and Power Supply Applications", IBM 2008 Power and Cooling Symposium, Sep. 30, 2008, 34 pages.

Application and File History for U.S. Appl. No. 12/963,817, filed Dec. 9, 2010, Inventors: Ausserlechner et al.

Application and File History for U.S. Appl. No. 12/711,471, filed Feb. 24, 2010, Inventors: Ausserlechner et al.

Application and File History for U.S. Appl. No. 12/963,787, filed Dec. 9, 2010, Inventors: Ausserlechner et al.

Application and File History for U.S. Appl. No. 12/756,652, filed Apr. 8, 2010, Inventors: Ausserlechner.

Application and File History for U.S. Appl. No. 12/872,665, filed Aug. 31, 2010, Inventors: Ausserlechner et al.

Application and File History for U.S. Appl. No. 13/012,096, filed Jan. 24, 2011, Inventors: Ausserlechner et al.

Application and File History for U.S. Appl. No. 13/086,566, filed Apr. 14, 2011, Inventors: Ausserlechner.

Application and File History for U.S. Appl. No. 13/626,456, filed Sep. 25, 2012, Inventors: Ausserlecher et al.

Steiner et al., "Fully Packaged CMOS Current Monitor Using Lead-On-Chip Technology," *Physical Electronics Laboratory*, pp. 603-608, © 1998.

Lutz et al., "Double-Sided Low-Temperature Joining Technique for Power Cycling Capability at High Temperature," EPE 2005-Dresden, ISBN: 90-75815-08-5.

Schwarzbauer et al., "Novel Large Area Joining Technique for Improved Power Device Performance," *IEEE Transactions on Industry Applications*, vol. 27, No. 1, pp. 93-95, 1991.

Application and File History of U.S. Appl. No. 12/630,596, Inventor: Ausserlechner, filed Dec. 3, 2009.

* cited by examiner

MAGNETIC FIELD CURRENT SENSORS

FIELD OF THE INVENTION

The invention relates generally to current sensors and more particularly to integrated circuit magnetic field current sensors.

BACKGROUND

Conventional integrated circuit (IC) current sensor devices can be generally divided into two groups: high current and low current. High-current devices can be those used for currents in excess of 50 Amps (A) and comprise massive conductors, such as portions of the leadframe. These devices typically have a low internal resistance, which is desired, but they also suffer from low current density and assembly tolerances challenges between the conductor and the semiconductor die. Low-current devices are typically suitable for currents of 10 A or less and often comprise conductors that are manufactured on the surface of the die in the semiconductor manufacturing process. While low-current devices do not suffer from assembly tolerance issues, these devices are challenged by high internal resistance and power dissipation issues.

Therefore, there is a need for an IC current sensor device suitable for a range of currents, such as about 75 A or less, that do not have the high resistance issues of the aforementioned low-current devices while also having better alignment than the high-current devices.

SUMMARY

In an embodiment, a current sensor comprises a semiconductor die; an isolation layer disposed on the semiconductor die; at least one anchor pad disposed on the isolation layer; a current input and a current output galvanically isolated from the semiconductor die; at least one bond wire coupled to the current input and the current output, a longitudinal portion of the at least one bond wire disposed between the current input and the current output being stitched to the at least one anchor pad; and at least one sensor element arranged to sense a magnetic field induced by a current flowing in the at least one bond wire.

In an embodiment, a method comprises providing a magnetic field current sensor having at least one bond wire coupled at a stitch between a current input and a current output to at least one anchor pad, wherein the current input, the current output, the at least one bond wire and the at least one anchor pad are galvanically isolated from a die, and at least one sensor element is arranged proximate the stitch to sense a magnetic field induced by current flow in the at least one bond wire.

In an embodiment, a current sensor comprises a semiconductor die; an isolation layer disposed on the semiconductor die; at least one anchor pad disposed on the isolation layer; a current input and a current output galvanically isolated from the semiconductor die; at least one bond strip coupled to the current input and the current output, a portion of the at least one bond strip disposed between the current input and the current output being coupled to the at least one anchor pad; and at least one sensor element arranged to sense a magnetic field induced by a current flowing in the at least one bond strip.

In an embodiment, a current sensor comprises a semiconductor die; an isolation layer disposed on the semiconductor die; a plurality of anchor pads disposed on the isolation layer; a leadframe conductor galvanically isolated from the semiconductor die and comprising a current output portion and first and second current input portions; a first bond wire coupled to the first current input portion and the current output portion, a portion of the first bond wire between the first current input portion and the current output portion being coupled to a first of the plurality of anchor pads; a second bond wire coupled to the second current input portion and the current output portion, a portion of the second bond wire between the second current input portion and the current output portion being coupled to a second of the plurality of anchor pads; and a plurality of sensor elements arranged to sense magnetic fields induced by current flowing in the first and second bond wires.

BRIEF DESCRIPTION OF THE DRAWINGS

The invention may be more completely understood in consideration of the following detailed description of various embodiments of the invention in connection with the accompanying drawings, in which.

Figure 1:
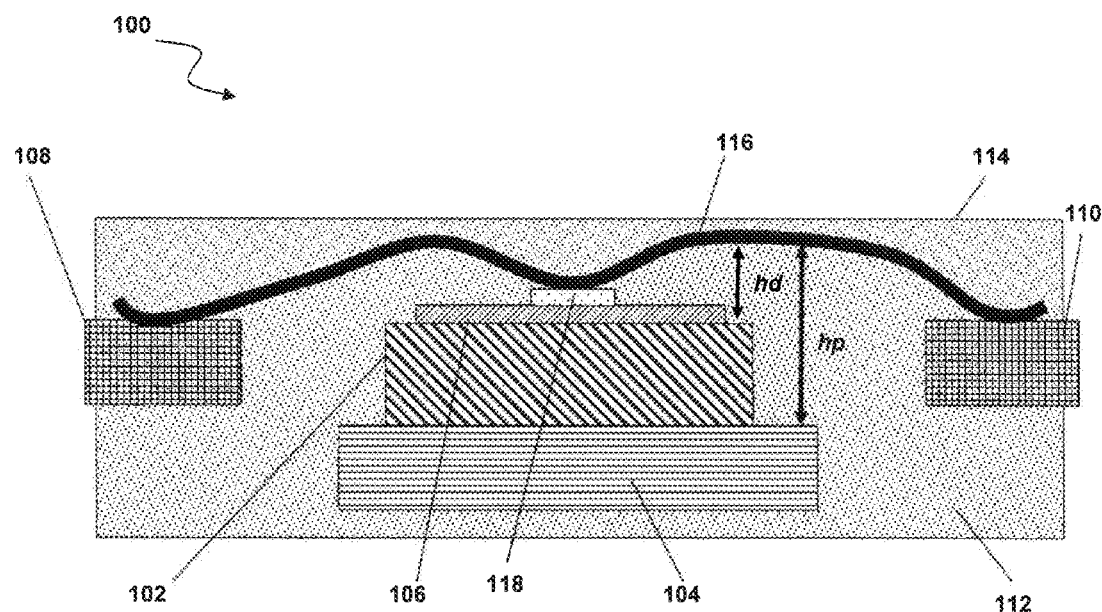
FIG. 1 depicts a cross-sectional view of a current sensor device according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The invention relates to IC magnetic field current sensing devices. In embodiments, current sensor devices comprise an anchored bond wire configuration that results in fewer contacts, and therefore lower internal resistance, less heat generation and smaller space requirements. Embodiments therefore also exhibit improved reliability and a stable magnetic field per amp over the lifetime of the device.

Referring to FIG. 1, a cross-section of an embodiment of an IC current sensor device 100 is depicted. Device 100 comprises a silicon die 102 mounted to a die paddle 104. A dielectric isolation layer 106 is arranged on die 102. A current input pin 108 and a current output pin 110, as well as die 102, are enclosed in an embodiment by a mold compound 112 of a device package 114, and a bond wire 116 couples input pin 108 to output pin 110. Pins 108 and 110 are galvanically isolated from die 102 in embodiments. While no electrical connection of additional pins to die 102 is depicted in the view of FIG. 1, those skilled in the art will appreciate that such connection can be accomplished in various ways. In embodiments, including those discussed herein below, one or both of input pin 108 and output pin 110 can comprise a pin, a pad, a lead, a ball, a land and a leadframe conductor, as understood by those skilled in the art.

In an embodiment, bond wire 116 is also coupled to an anchor pad 118 disposed on isolation layer 106. Anchor pad 118 is electrically floating, galvanically isolated from die 102, and fixes relatively thick, and therefore low ohmic, bond wire 116 with respect to sensor elements, such as Hall sensors (not depicted in FIG. 1), which are positioned nearby, such that the sensor elements sense a magnetic field of current passing through bond wire 116 in operation. In an embodiment, anchor pad 118 comprises an ordinary metal, such as aluminum, or a metal alloy in other embodiments.

Bond wire 116 is coupled to anchor pad 118 by a "stitch" in the direction of current flow in an embodiment. In general, the length of the stitch is greater than the width. In embodiments, bond wire 116 can be coupled to anchor pad 118 and/or pins 108 and 110 by direct copper bonding, ball bonding, wedge bonding, nail head bonding or some other suitable technique understood by one having skill in the art. As understood by those skilled in the art, the bonding technique can depend on one or more characteristics of bond wire 116, such as its material, thickness or some other quality. For example, wedge bonding is typical for aluminum bond wires, while nail head bonding can be more appropriate for thinner bond wires. Bond wire 116 forms a loop such that it is also separated from an edge of die 102 by a distance hd in embodiments in order to provide electrical isolation. In one embodiment, hd is about 0.3 millimeters (mm), which provides electrical isolation of 6 kilo-Volts (kV) or more. In other embodiments, hd varies, such as between about 0.1 mm and about 0.3 mm, and/or can be larger or smaller.

Figure 2:
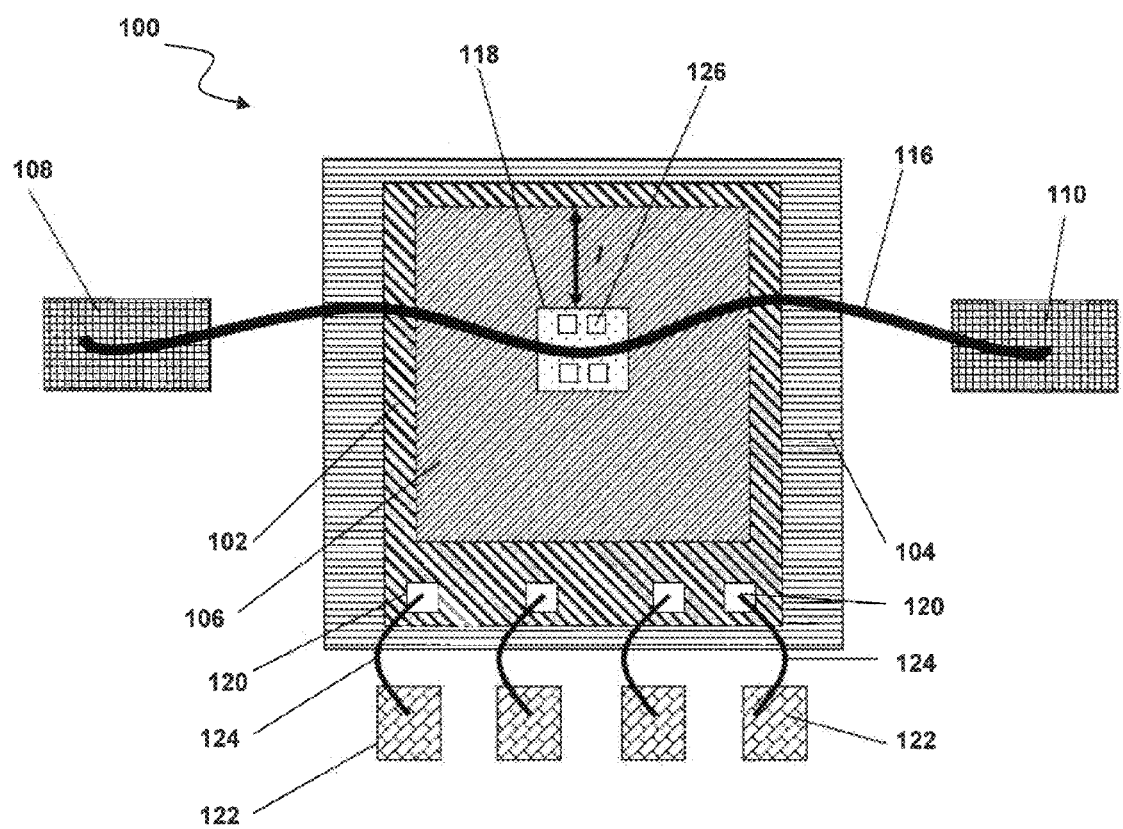
FIG. 2 depicts a top view of a current sensor device according to an embodiment.

A top view of current sensor device 100 is depicted in FIG. 2. In FIG. 2, electrical and output signal connections to die 102 are included, in the form of bond pads 120 on die 102 coupled to pins 122 via bond wires 124. Although bond wire 124 is depicted curvilinearly in FIG. 2 and in other drawings herein, it can in fact be substantially linear when viewed from the top in embodiments.

Also depicted are a plurality of sensor elements 126 disposed relative to anchor pad 118 and bond wire 116. Four sensor elements 126, such as Hall effect elements, are depicted in FIG. 2, though other embodiments can comprise more or fewer. In embodiments, sensor elements 126 are arranged proximate the portion of bond wire 116 coupled to anchor pad 118, which advantageously provides stability in the distance between sensor elements 126 and bond wire 118 via which sensor elements 126 measure the magnetic field over the lifetime of device 100, as well as stability of the magnetic field per amp. Sensor elements 126 are generally positioned to the left and right (with respect to the direction of current flow) of bond wire 116, and underneath and/or in close proximity to anchor plate 118. If the signals of sensor elements 126 are subtracted, the total signal becomes independent of homogeneous background magnetic fields. Thus, static or transient differential fields can be measured.

Additional advantages are provided by device 100. For example, because only a single contact between bond wire 116 and anchor pad 118 is utilized, compared with conventional devices having two for current input and output, less die area is needed. Further, the small size of anchor plate 118 maximizes the lateral creepage distances and provides good isolation by separating anchor plate 118 from the edge of isolation layer 106, depicted at l in FIG. 2 in one dimension though applicable to all four, which may or may not be equal, which in turn improves the voltage breakdown reliability. Because the current does not leave bond wire 116, the bond to anchor plate 118 is subjected to less stress, increasing the reliability of the bond. Anchor plate 118 also does not need to be particularly thick or low-ohmic, such that less expensive aluminum can be used instead of copper.

In other embodiments, device 100 comprises two or more bond wires 116 arranged in parallel and spaced apart by about 0.5 mm to about 2 mm in embodiments. The plurality of bond wires 116 can be anchored on a single anchor plate 118 or on different anchor plates 118. In another embodiment, bond wires 116 may not be anchored at all, instead shunting a portion of the current. Sensor elements 126 can be arranged next to the one or more anchor plates 118.

Figure 3:
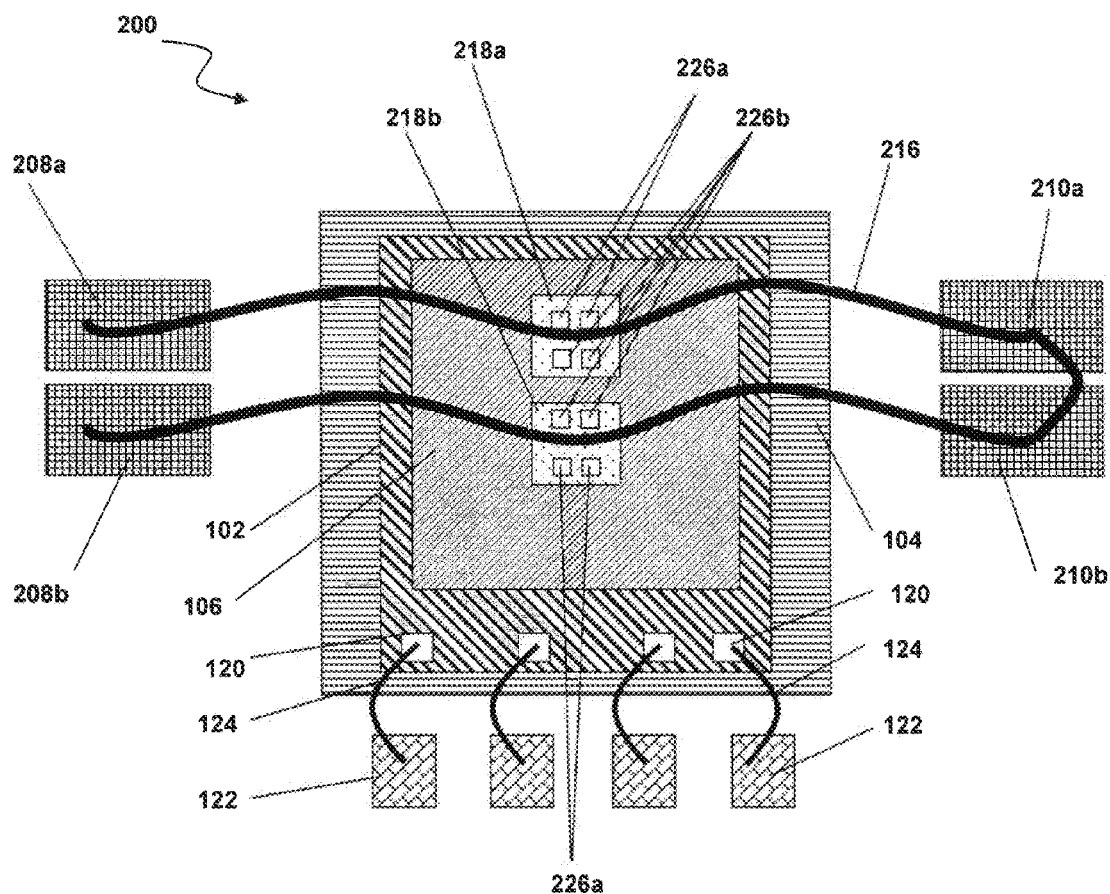
FIG. 3 depicts a top view of a current sensor device according to an embodiment.

Another embodiment of a sensor device 200 is depicted in FIG. 3, in which current flows in opposite directions through neighboring bond wire portions. The upper portion (with respect to the orientation of the drawing on the page) of bond wire 216 is anchored to a first anchor plate 218a, while the lower portion of bond wire 216 is anchored to a second anchor plate 218b. Anchor plates 118a and 118b are spaced apart and electrically isolated from each other, though the isolation typically needs only to withstand a few volts because the voltage drop along bond wire 216 is small. Device 200 also comprises two current input pins 208a, 208b and two current output pins 210a, 210b. The embodiment of FIG. 3 depicts only the bond pads of the pins, and in embodiments each pin may have a separate bond pad, or multiple bond pads may couple to a single pin. In other embodiments, pin 208a can be an input and pin 208b an output such that pins 210a, 210b are neither inputs nor outputs and can only optionally be accessible externally.

Figure 4:
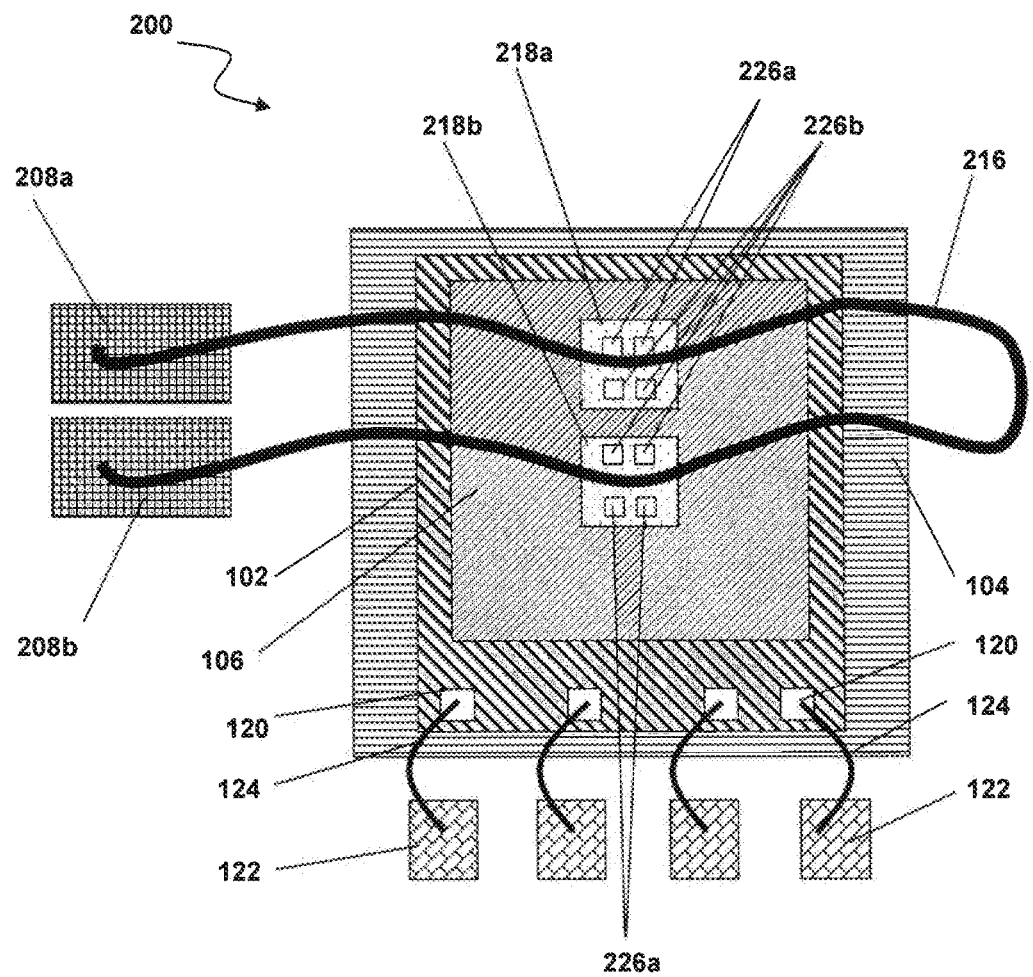
FIG. 4 depicts a top view of a current sensor device according to an embodiment.

In an embodiment, output pins 210a, 210b can be partially or completely enclosed by mold compound (not depicted in FIG. 3), or pins 210a, 210b can be fully accessible from outside a package of device 200. In another embodiment, pins 210a, 210b can comprise a single pin sized in order to bond two wires, or portions of bond wire 216. In yet another embodiment, as depicted in FIG. 4, pins 210a, 210b can be omitted entirely.

In general, an advantage of the configuration of device 200 is reduced susceptibility to magnetic interference because the signals of sensor elements 226b can be subtracted from the signals of sensor elements 226a. This provides an operative triple-Hall current sensor device, such as is disclosed in related and co-pending U.S. application Ser. No. 12/630,596, entitled "Magnetic Field Current Sensors," which is incorporated herein by reference in its entirety. Device 200 can also provide improved crosstalk suppression. A drawback, however, can be higher resistance because bond wire 216 is longer.

It can be advantageous in embodiments to have certain distance hp (refer, for example, to FIG. 1) between the bond wire and the die paddle because the magnetic field of the bond wire can induce eddy currents in the die paddle which can reduce the bandwidth of the current sensor device. To increase this distance hp, a thickness of the die can be maximized in embodiments.

Eddy currents can also occur in the anchor plate. To minimize these currents, the anchor plate comprises one or more slots in an embodiment. It can also be advantageous to shield components of the current sensor device disposed below the anchor plate from the electric field that can be established between the anchor plate and the circuit elements of the sensor in embodiments.

With respect to the package of the current sensor device (refer, for example, to package 114 of FIG. 1), non-magnetic materials are used in embodiments, with iron and nickel being disadvantageous. Package materials have a relative permeability close to or about one in embodiments.

Figure 5:
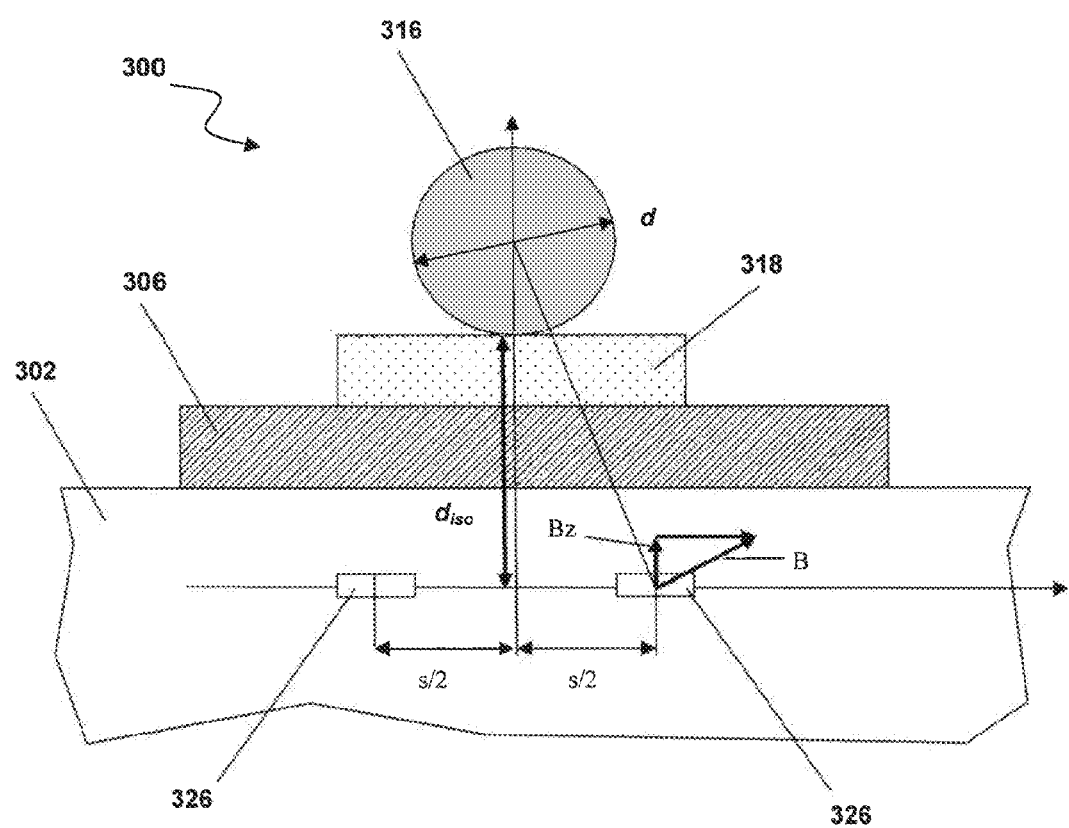
FIG. 5 depicts a cross-sectional view of a current sensor device according to an embodiment.

FIG. 5 depicts an embodiment of a current sensor device 300 dimensioned for approximating the magnetic field therein. Similar to embodiments discussed herein above, sensor device 300 comprises a die 302, isolation layer 306, bond wire 316, anchor pad 318 and sensor elements 326. A diameter d of bond wire 316 is depicted, as is an isolation gap $d_{iso}$ and distance s separating sensor elements 326.

A current I through bond wire 316 can be expressed as follows:

$$(B/\mu_0)*2*\pi*\text{square root}((s/2)^2+(d_{iso}+d/2)^2)$$

The maximum field is given for $s=d+2*d_{iso}$:

$$B_z=\mu_0*I/(2*\pi*(d+2*d_{iso})),$$

which provides, for example, about 18.5 mT at 50 A and $d_{iso}+d/2$=about 0.54 mm. The differential field, or the difference in the field on the left and right sensor elements 326 is twice as large.

The resistance of bond wire 326 at, for example, d=about 0.5 mm is:

$$\text{Rho}*\text{length/cross-sectional area}.$$

In an example embodiment, the length of bond wire 326 is about 5 mm, the cross-sectional area is $\pi*(0.25\text{ mm})^2$ and Rho is 1/(34 S/μm), providing a resistance of about 0.75 mΩ. While the resistance is not low, it can be common in power modules and other devices having applicability to put about 50 A through a single wire. Thus, bond wire 326 can handle the current and resistance with, in embodiments, sufficient cooling.

Figure 6A:
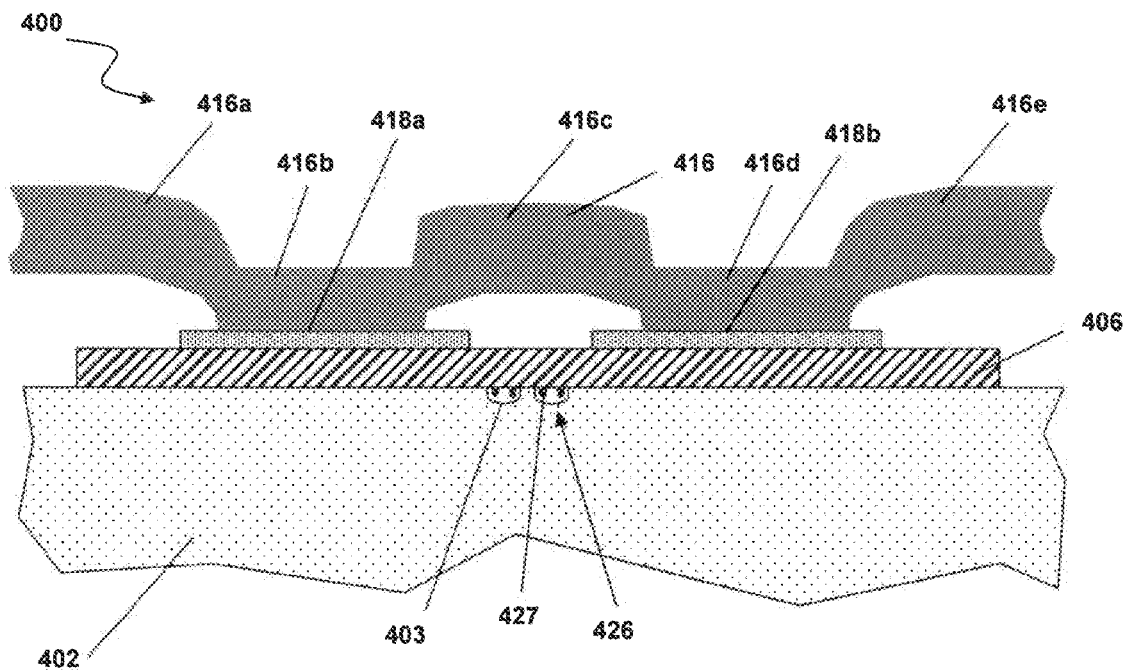
FIG. 6A depicts a cross-sectional view of a current sensor device according to an embodiment.
Figure 6B:
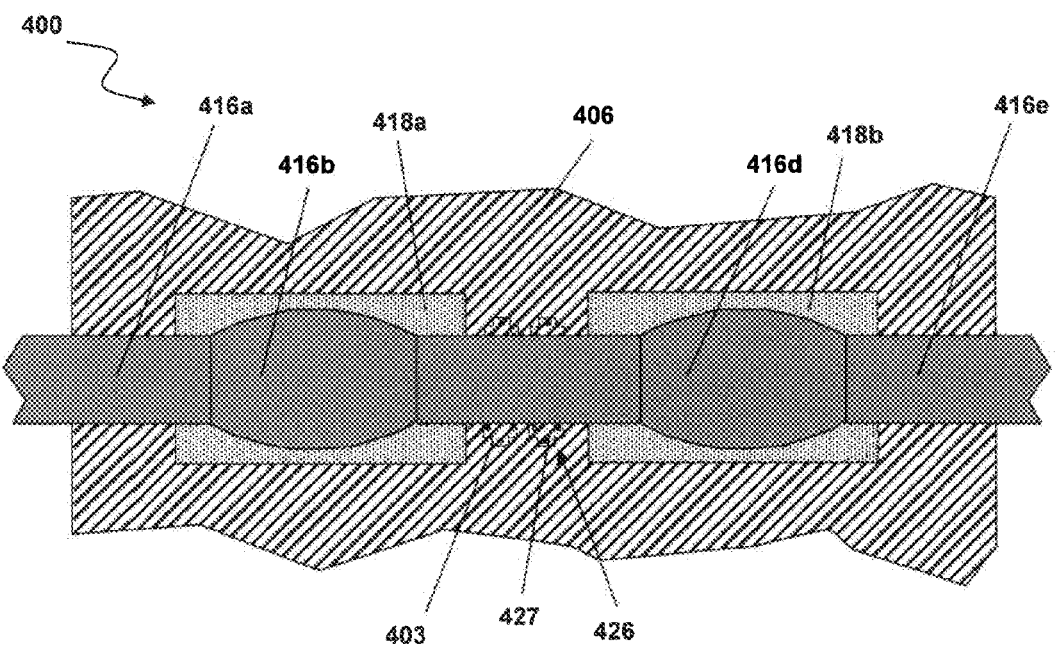
FIG. 6B depicts a top view of the current sensor device of FIG. 6A.

Another embodiment of a current sensor device including an anchored bond wire is depicted in FIG. 6, in which the bond wire is anchored with two wedge bond stitches. Sensor 400 comprises a substrate 402, such as bulk silicon in an embodiment, and an isolation layer 406, such as silicon oxide. In an embodiment, isolation layer is about 10 μm thick. A bond wire is shown at 416 and can comprise aluminum, gold and/or copper in embodiments though is generally a non-magnetic metal.

Substrate 402 includes doped tubs 403 for sensor elements, such as Hall effect devices in an embodiment. Tubs 403 can be low n-doped at $10^{15}/cm^3$, for example. While the embodiment of FIG. 6 includes four sensor elements 426, other embodiments can have more or fewer, such as only one. Further, the lateral position of sensor elements 426 with respect to bond wire 416 is generally not critical, such that one or both of sensor elements 426 can be shifted in embodiments with one completely under bond wire 416 or neither being overlapped by wire 416, for example. Sensor elements 426 includes contacts 427, which can be high n-doped, such as about $10^{17}/cm^3$ or more in an embodiment. Each sensor element 426 typically includes four contacts 427.

As depicted, bond wire 416 comprises sections having varying cross-sections and thicknesses and is anchored to sensor 400 at anchor pads 418a and 418b, referred to collectively as anchor pads 418. Anchor pads 418 can comprise metal and, in embodiments, are not electrically coupled to any portion of substrate 402 or to each other. Sections 416a and 416e are current input and output sections of bond wire 416. At 416b and 416d, bond wire 416 is stitched to anchor pads 418a and 418b, respectively. In an embodiment, a nozzle of a wedge bond tool can push bond wire 416 down onto anchor pads 418 during wire-bonding, deforming sections 416b and 416d. Middle section 416c remains as a bridge between the stitches at 416b and 416d.

An advantage of the embodiment of sensor 400 is that sensor elements 426 are not physically stressed by the stitching process because sensor elements 426 are not disposed directly underneath the stitches 416b and 418a, and 416d and 418b. A disadvantage, however, can be the larger vertical distance between bond wire 416 and sensor elements 426, as well as greater lateral space consumption.

Figure 7A:
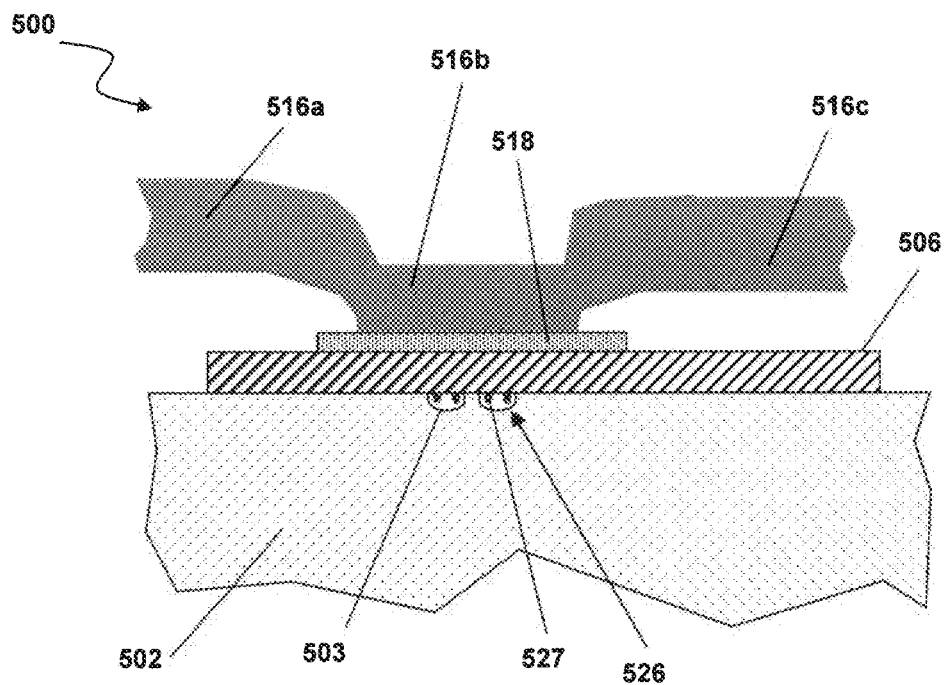
FIG. 7A depicts a cross-sectional view of a current sensor device according to an embodiment.
Figure 7B:
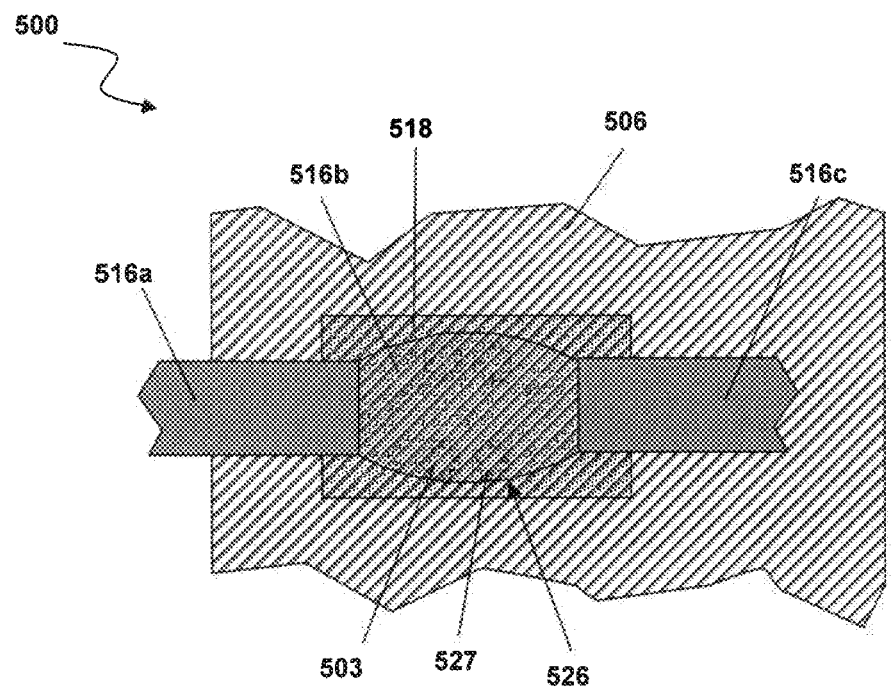
FIG. 7B depicts a top view of the current sensor device of FIG. 7A.

Another embodiment of a current sensor device 500 is depicted in FIG. 7. An advantage of sensor 500 as compared with sensor 400 is that the vertical distance between the stitch portion 516b of bond wire 516 and the Hall effect sensor elements 526 is smaller, while the thickness of stitch portion 516b is also smaller such that the current density and therefore the magnetic field are also larger. In FIG. 7B, stitch portion 516b is shown transparently so that Hall sensor elements 526 can be seen below (with respect to the orientation on the page). Sensor elements 526 are entirely covered by stitch portion 516b in an embodiment, which can lead to increased mechanical stresses on elements 526 during manufacturing. If other metal parts are included in other embodiments, such as in embodiments in which the technology provides for several metal layers as is often common in CMOS processes, for example wires connecting various devices, like transistors with Hall elements 526 or top plates used to define the potential lines in the vicinity of the active volume of Hall elements 526 in order to keep lifetime drift low, it could be advantageous to use cheesing techniques. For example, oxide pillars could be inserted into large metal parts in order to mechanically stabilize the vertical structure. Such oxide pillars are more robust against mechanical loads than widely used aluminum for on-chip wiring, which can be soft and ductile.

Figure 8A:
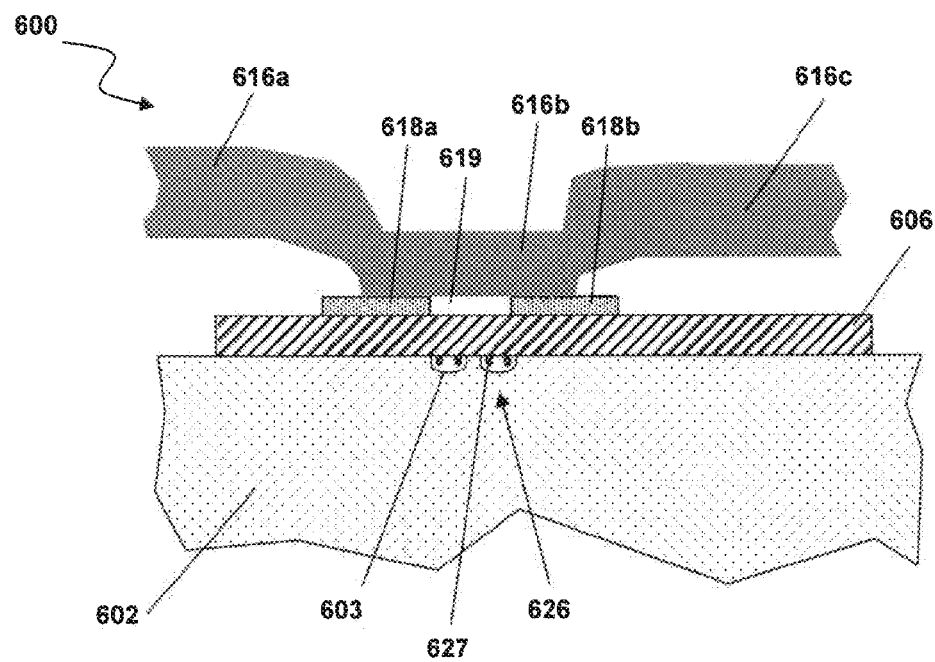
FIG. 8A depicts a cross-sectional view of a current sensor device according to an embodiment.
Figure 8B:
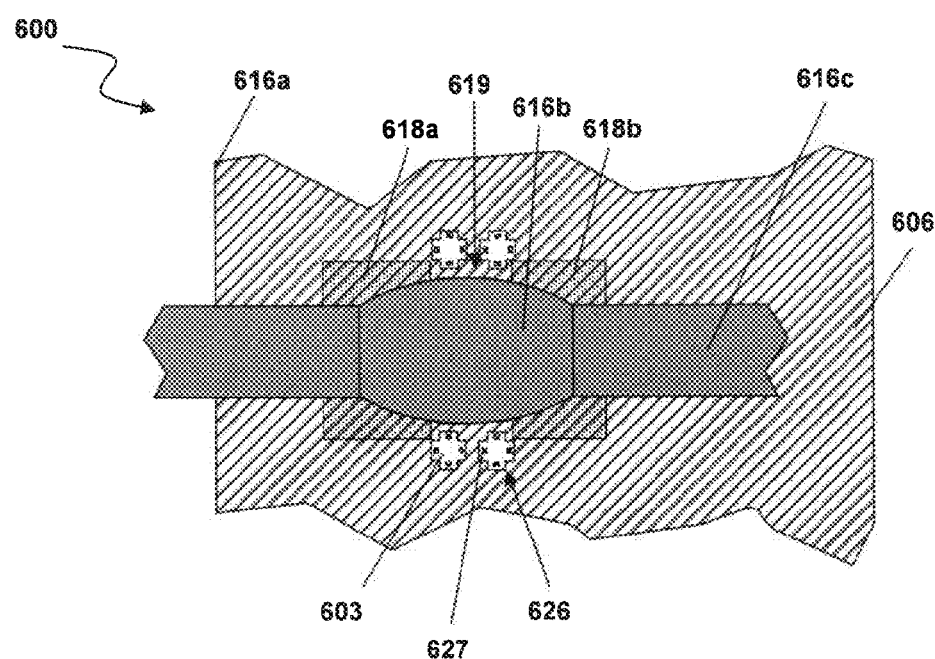
FIG. 8B depicts a top view of the current sensor device of FIG. 8A.

Yet another embodiment of a sensor device 600 is depicted in FIG. 8, in which anchor pad 618 includes two portions 618a and 618b and a gap 619 between such that there is no metal pad above Hall effect elements 626. In one embodiment, portions 618a and 618b are positioned at either end of stitch portion 616b, with gap 619 disposed at or near the center of stitch portion 616b. Such a configuration can reduce eddy currents at high frequencies. In FIG. 8B, it can be seen that Hall effect elements 626 are shifted away from bond wire 616, which can reduce mechanical stresses on elements 626 during the bond process. The size and positioning of Hall elements 626 is not necessarily related to the size of portions 618a and 618b of anchor pad 618. In an embodiment, the positioning of Hall elements 626 is selected in order to maximize the magnetic field acting upon them and to minimize mechanical stresses during bonding.

While embodiments discussed herein generally comprise bond wire stitches arranged in one or more straight and parallel lines, which is typically the easiest way to manufacture such devices, other stitching configurations are also possible. Referring to FIG. 9, another embodiment is depicted in sensor device 700. In sensor 700, a single bond wire 716 is wedged on a lead 708, stitched onto die 702 at anchor pad 718, and wedged on a lead 710. The wedged and stitched portions of bond wire 716 are linearly arranged and generally truncated ellipsoid shapes due to the physical wedging and stitching. Die paddle 704 can be coupled to a sensor lead 709 and can also be integrally formed with a ground pin in an embodiment. A bond wire 717 couples die 702 to lead 709. In FIG. 9, bond wire 717 is depicted with ball bonds, though other bonding techniques can be used in other embodiments, such as wedge bond wires.

Figure 9A:
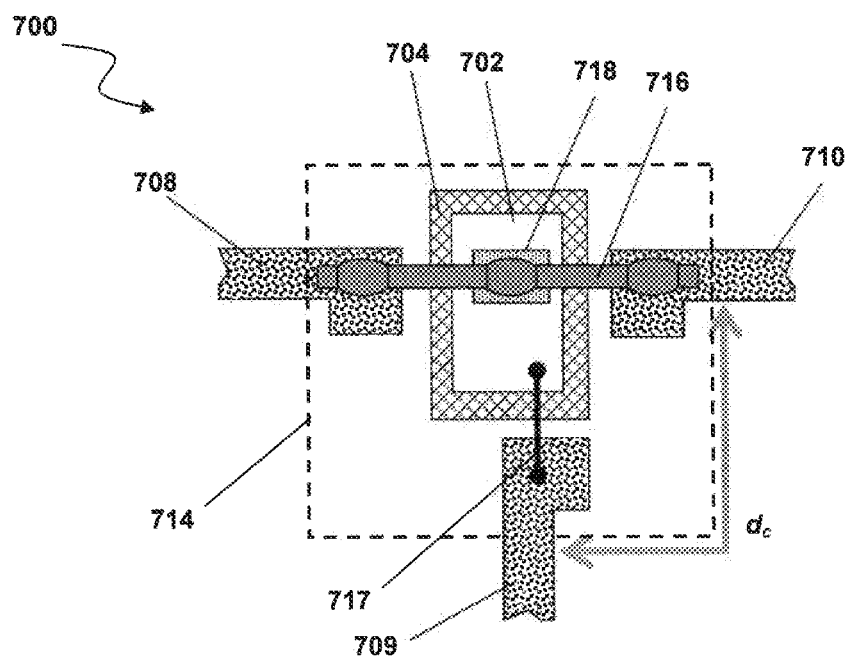
FIG. 9A depicts a top view of a current sensor device according to an embodiment.
Figure 9B:
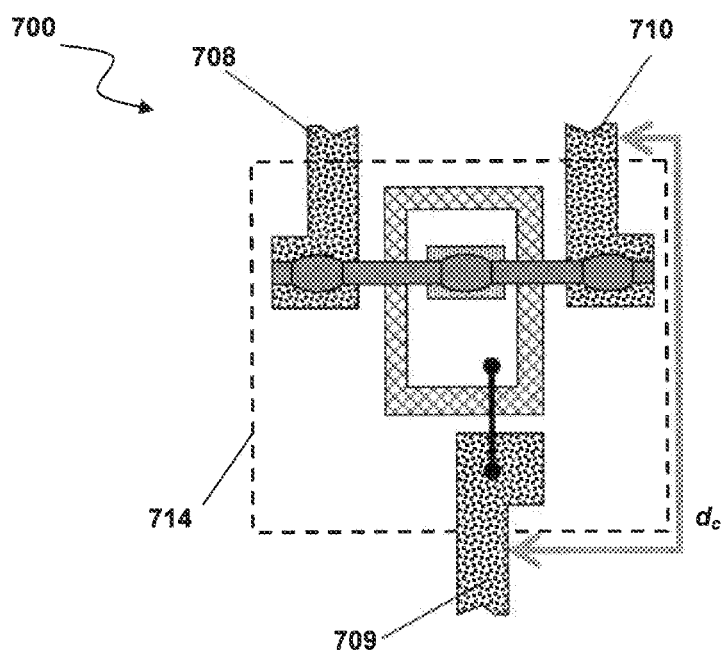
FIG. 9B depicts a top view of a current sensor device according to an embodiment.

It can be advantageous in embodiments to have the current input and output terminals not on opposite sides of package 714 because it can be better to arrange all current contacts on a single side of package 714 and all other contacts, such as supply and signals of sensor 700, on the opposite side of package 714. This maximizes the creepage distance between both, which is beneficial because large creepage distance can ensure good voltage isolation between the high current path and the signal path. FIG. 9A shows only one exemplary signal pin 709, and the resulting external creepage distance illustrated at $d_c$ is the minimum distance between lead 709 and lead 710 outside package 714. An embodiment of sensor 700 having a larger creepage distance $d_c$ is depicted in FIG. 9B.

Figure 10:
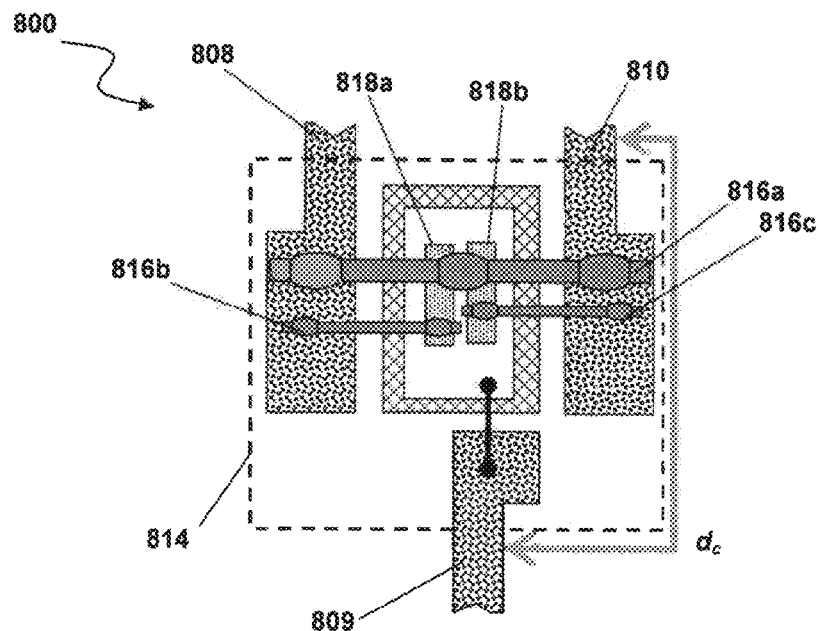
FIG. 10 depicts a top view of a current sensor device according to an embodiment.

In FIG. 10, a current sensor device 800 includes two anchor portions 818a and 818b and additional bond wires 816b and 816c with bond wire 816a. These additional bond wires 816b and 816c reduce the internal resistance. In an embodiment, only bond wire 816a connects anchor pads 818a and 818b, such that all the current has to flow through this wire 816a. Bond wire 816a can have a smaller diameter than in other embodiments in order to increase the current density in the constriction and to minimize the vertical distance between the current and magnetic field elements (not pictured in FIG. 10). Bond wires 816b and 816c may also have smaller diameters because their smaller wedges can be accommodated on pads 818a and 818b. Bond wire 816a, however, provides the shortest path between input lead 808 and output lead 810, having lower contact resistance than other current paths.

Figure 11:
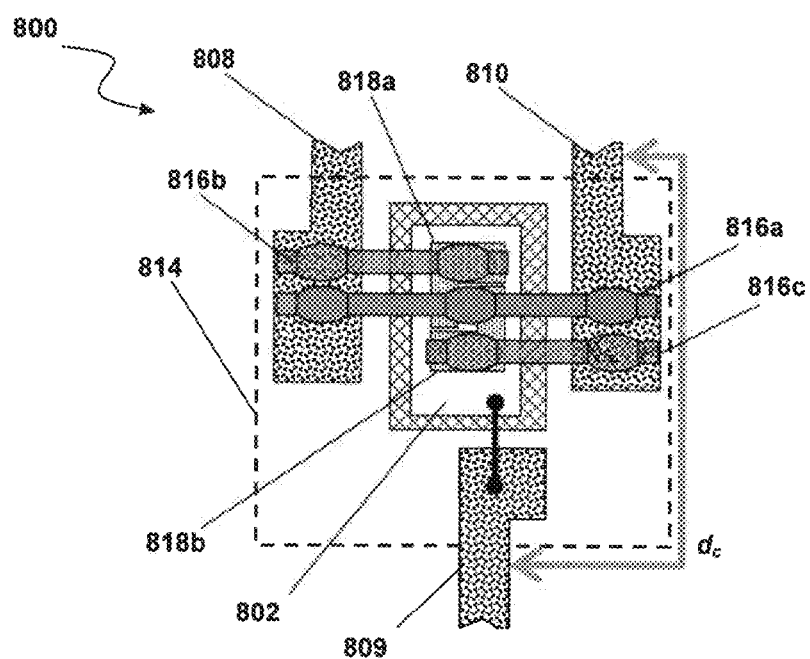
FIG. 11 depicts a top view of a current sensor device according to an embodiment.

It can be difficult to arrange two bond wires such that their wedge bonds to the anchor pads do not short the pads, such as 816b and 816c in FIG. 10. Anchor pads 818a and 818b should be shorted in an embodiment only by wire 816a, not by wires 816b and 816c. While ball bonding for wires 816b and 816c could be used, another solution is to use metal pads in an "L" configuration, laterally offset so that one wire 816b is to the left of wire 816a while wire 816c is to the right, such as is depicted in FIG. 11. In the embodiment of FIG. 11, die 802 can be in the range of about 300 μm to about 750 μm thick, generally avoiding being too thin because of the large forces acting on die 802 during the bonding process. As understood by one skilled in the art, anchor pads 818a and 818b should generally avoid internal corners around which current must flow because varying current densities are thus provided. Such corners are typically only necessary if more than one single wire is used because then only a portion of the current flows through wire 816b and pad 818a or wire 816c and pad 818b. Therefore, it can be advantageous for anchor pads 818a and 818b to be relatively thick, such as about 20 μm in an embodiment, whereas in other embodiments pads 818 can be only a few micrometers because no current flows through them. While embodiments having several bond wires in parallel generally have lower electrical and thermal impedances, these embodiments can also suffer from drawbacks, including large attractive forces between bond wires at large currents and eddy currents at high frequencies that can reduce bandwidth of the sensor.

Alternate bond wire configurations can also be used in other embodiments. For example, tape wires can be used in embodiments in place of more traditional round wires. Tape wires can provide advantages with respect to wire bonding techniques, mechanical stresses and reliability under thermal cycling. Tape wires can also be distinguished from conventional copper clips, which can have a similar geometry but different electrical contact and coupling. Another advantage of tape wires relates to the smaller thickness as compared to round wires. This can reduce the vertical distance between the sensor elements and current, thereby increasing the sensitivity of the sensor system to current. The shape of the tape strip can also be adjusted to reduce electrical and thermal resistances, and thereby dissipation, in embodiments. Embodiments can also include tape wire strips having holes or slots formed in them.

Figure 12A:
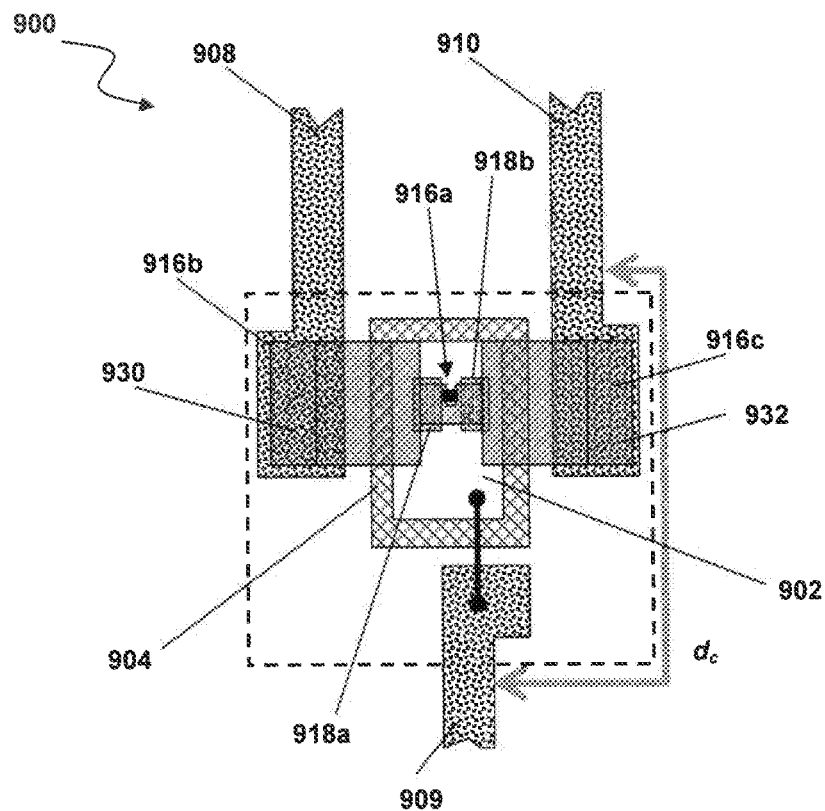
FIG. 12A depicts a top view of a current sensor device according to an embodiment.
Figure 12B:
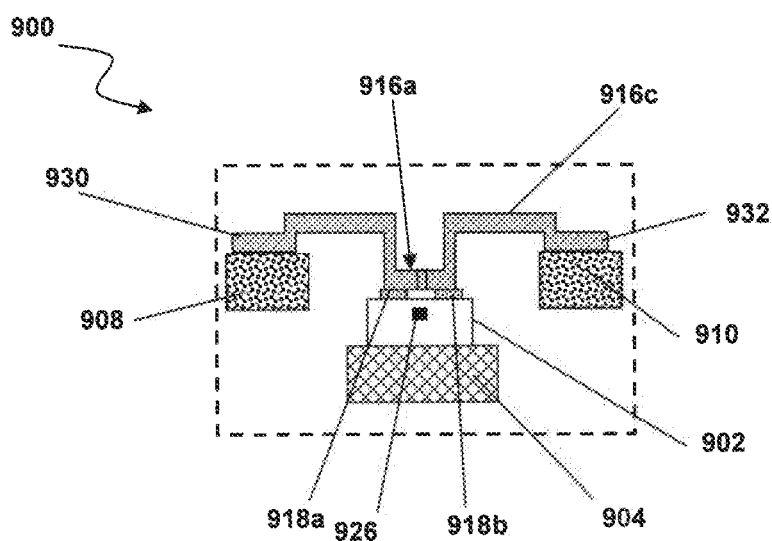
FIG. 12B depicts a cross-sectional view of the current sensor device of FIG. 12A.

One embodiment of a sensor 900 including a tape wire is depicted in FIG. 12. Sensor 900 includes a bonding tape strip layer 916, such as a low-temperature joining technique (LTJT) strip in an embodiment, and right and left contacts 930 and 932 for strip 916. In an embodiment, bond strip 916 is about 0.1 mm thick and can resemble a film or stripe of material in various other embodiments. A center portion 916a of bond strip 916 is coupled to metal anchor pads 918a and 918b, which are isolated from one another and from die 902 as discussed in other embodiments. Bridge portions 916b and 916c of strip 916 are elevated above the sawing edge of die 902 and the perimeter of the isolation layer (not shown) to provide voltage isolation between the current path and sensor circuit. A magnetic field sensor element, such as a Hall effect element, is shown at 926.

Figure 13A:
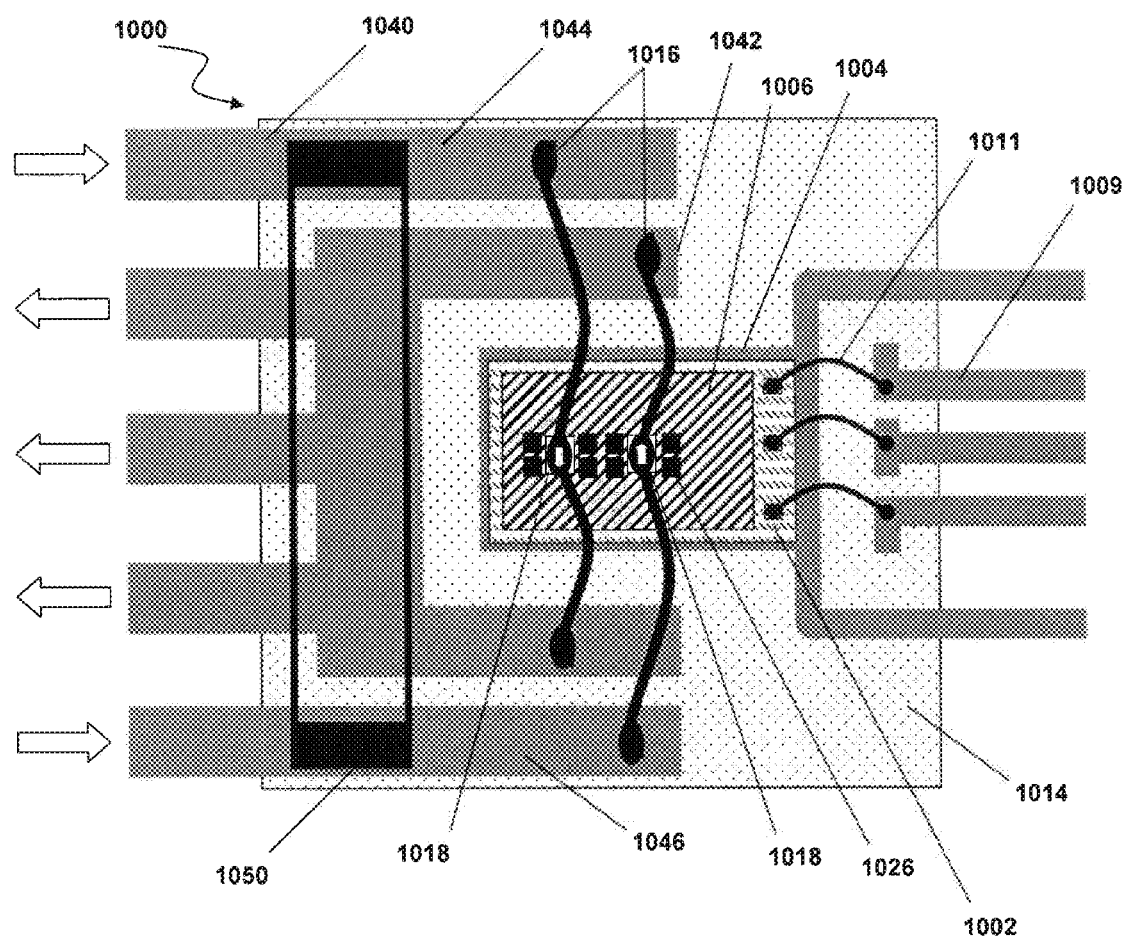
FIG. 13A depicts a top view of a current sensor device according to an embodiment.

Another embodiment is depicted in FIG. 13. In FIG. 13A, sensor 1000 includes two bond wires 1016 anchored on separate anchor plates 1018. Wires 1016 are coupled to a leadframe conductor 1040, which comprises three portions in an embodiment: a center portion 1042 which serves as a current output, and two outer portions 1044 and 1046 that serve as inputs. Portions 1042, 1044 and 1046 are coupled by a clip 1050, a center portion of which is depicted as transparent though which can be solid in physical embodiments. Such a configuration of sensor 1000 results in opposing direction of current flow in bond wires 1016 and lower resistance of the high current path.

Die paddle 1004 of sensor 1000 is not coupled to ground in an embodiment, as all signal pins 1009 are coupled with thin bond wires 1011 that act as fuses in case of a short. In embodiments, corners are generally rounded to reduce high voltage hazards, as previously mentioned and appreciated by those having skill in the art.

Hall plates are depicted at 1026 though in embodiments are positioned closer to bond wires 1016 such that the sensor elements 1026 are at least partially hidden by anchor plates 1018 and entirely hidden by isolation layer 1006. The output signals of Hall elements 1026 are S*Bz(x), with S, the sensitivity, being greater than zero and Bz(x) the vertical magnetic flux density component at a test point x. The total signal of sensor 1000 can be expressed as:

$$S*(-B_z(xL)+B_z(xC))-S*(-B_z(xC)+B_z(xR))$$

with xL left of the left bond wire 1016, xC between both bond wires 1016, and xR right of the right bond wire 1016. The current gives rise to the following fields:

$$B_z(xL)=-K'*I/2, B_z(xC)=2*K*I/2, B_z(xR)=-K'*I/2$$

where it is assumed that half of the current flows through each bond wire 1016. The magnitude of K' is slightly smaller than the magnitude of K. Combining both equations, the total signal is:

$$S*(K'*I/2+2*K*I/2)-S*(-2*K*I/2-K'*I/2)=S*(K'/2+K+K+K'/2)*I=S*(K'+2*K)*I$$

Assuming a linear field gradient $B_z=B0+b1*x$, a total signal of sensor 1000 is:

$$S*(-B0-b1*xL+B0+b1*xC)-S*(-B0-b1*xC+B0+b1*xR)=$$

$$S*b1*(-xL+xC+xC-xR)=$$

$$0 \text{ if } xL-xC=xC-xR$$

xC can be split into xC' and xC", with xC' being the location of the Hall plates 1026 belonging to the left bond wire 1016 and xC" being the location of the Hall plates 1026 belonging to the right bond wire 1016, with the same result.

Figure 13B:
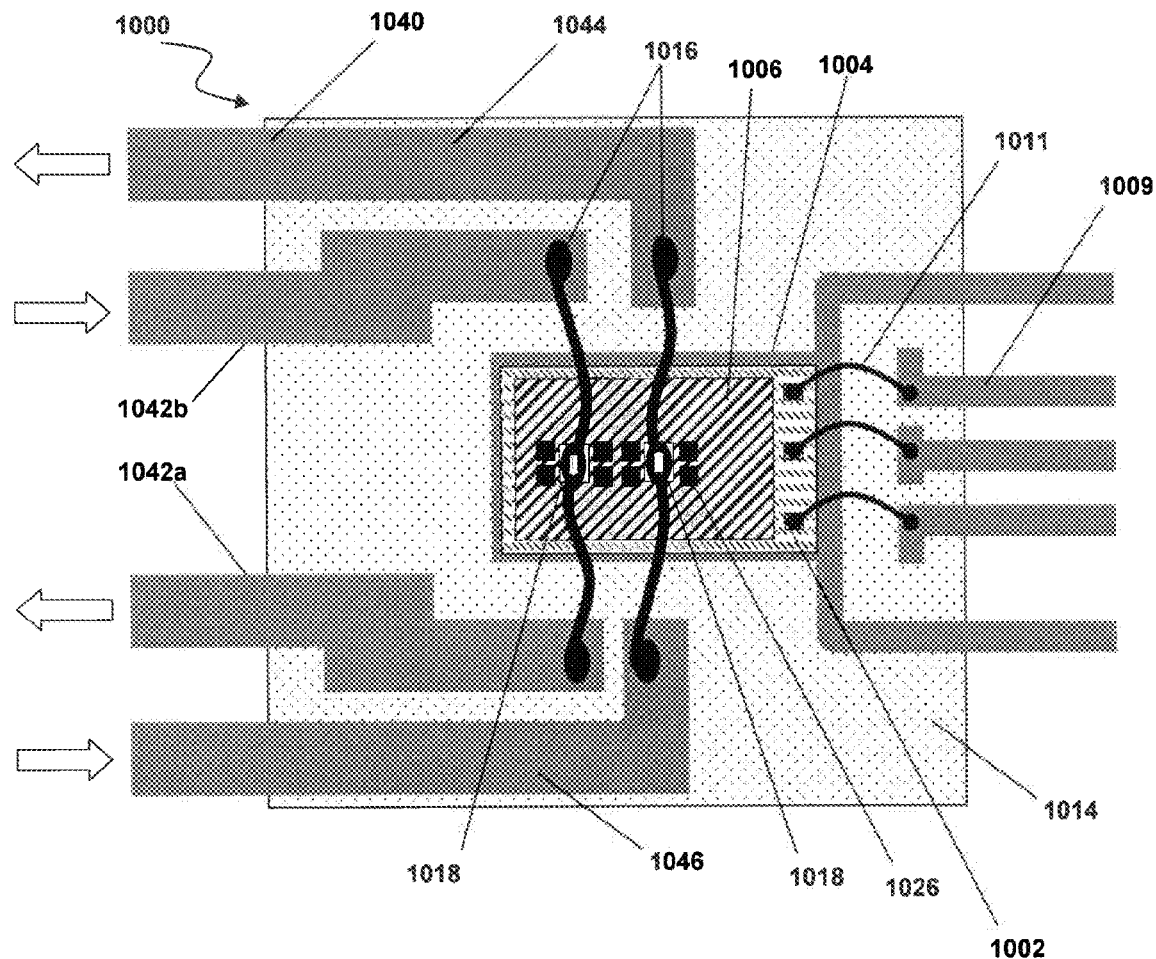
FIG. 13B depicts a top view of a current sensor device according to an embodiment.

In an embodiment, die 1002 is about 2 mm by about 4 mm. Bond wires 1016 are about 10 mm long with a diameter of about 0.5 mm and spaced apart by about 0.5 mm to about 1 mm. Mold body 1014 can be about 10 mm by about 10 mm. The resistance of one bond wire 1016 is about 1.5 mΩ, with two wires 1016 in parallel having about 750 μΩ at room temperature. Thus, the resistance of the current path is about 850 μΩ at 20° C., or about 1.3 mΩ at 150° C. Clip 1050 can be omitted in embodiments if a connection between outer portions 1044 and 1046 is made via the printed circuit board (PCB), onto which the sensor is soldered. Moreover, it is also possible to make bond wires 1016 shorter if leadframe 1040 is differently arranged, such as is depicted in FIG. 13B. In FIG. 13B, leadframe 1040 comprises an upper portion 1044, a lower portion 1046 and two inner portions 1042*a* and 1042*b*.

Figure 14:
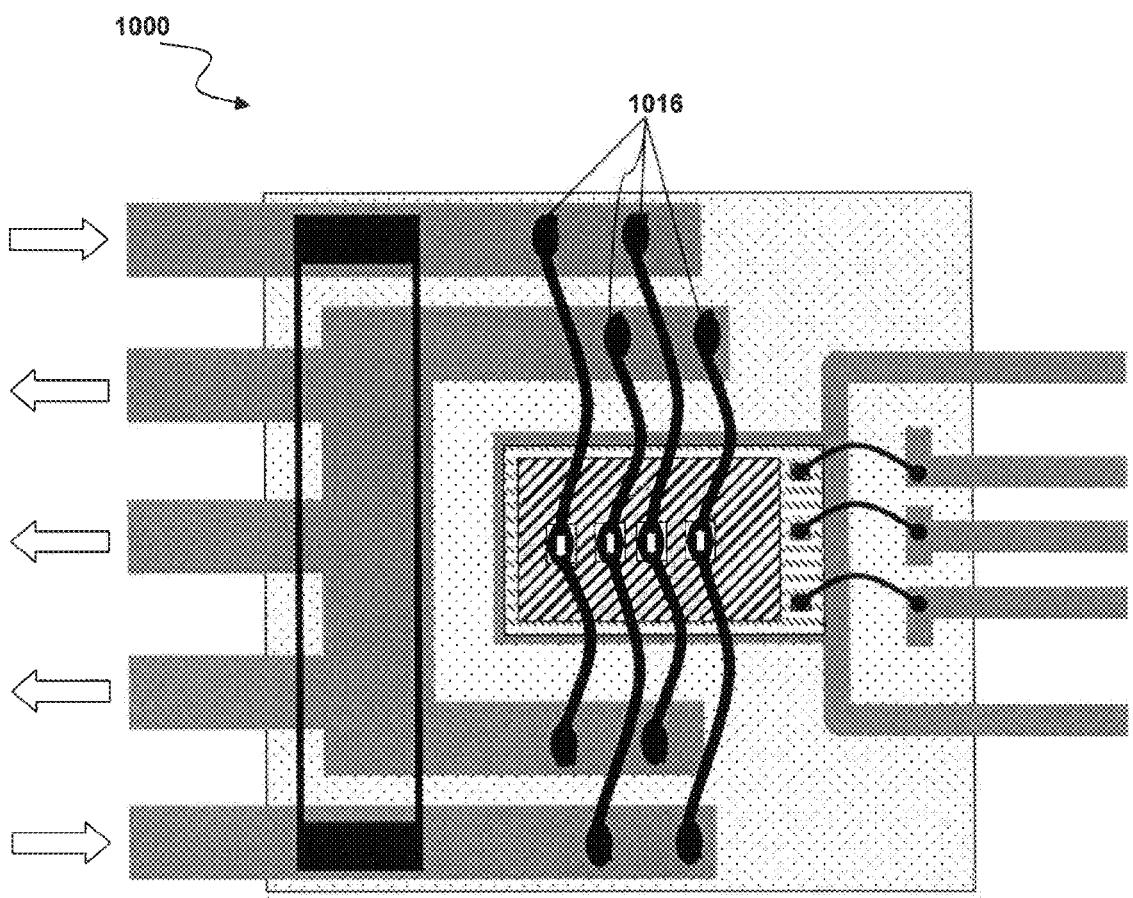
FIG. 14 depicts a top view of a current sensor device according to an embodiment.

The primary resistance of sensor 1000 can be reduced further by connecting four bond wires 1016 in parallel, as depicted in sensor device 1000 in FIG. 14. This also reduces the magnetic field because of destructive interaction.

Embodiments thereby providing current sensors and current sensing devices, systems and methods having an anchored bond wire configuration that provide advantages over conventional devices, systems and methods. Embodiments can have fewer contacts and therefore lower internal resistance, less heat generation and smaller space requirements. Embodiments also can exhibit improved reliability and a stable magnetic field per amp over the lifetime of devices.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, implantation locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A current sensor comprising:
a semiconductor die;
an isolation layer disposed on the semiconductor die;
at least one anchor pad disposed on the isolation layer;
a current input and a current output galvanically isolated from the semiconductor die;
at least one bond wire coupled to the current input and the current output, a longitudinal portion of the at least one bond wire disposed between the current input and the current output being stitched to the at least one anchor pad; and
at least one sensor element arranged to sense a magnetic field induced by a current flowing in the at least one bond wire.

2. The current sensor of claim 1, wherein the at least one anchor pad comprises a metal.

3. The current sensor of claim 1, further comprising a die paddle coupled to the semiconductor die.

4. The current sensor of claim 1, wherein a length of the longitudinal portion of the at least one bond wire stitched to the at least one anchor pad is greater than a width of the longitudinal portion of the at least one bond wire stitched to the at least one anchor pad.

5. The current sensor of claim 1, wherein the longitudinal portion of the at least one bond wire is stitched to the at least one anchor pad by a technique selected from the group consisting of direct copper bonding, ball bonding, wedge bonding and nail head bonding.

6. The current sensor of claim 1, wherein non-stitched portions of the at least one bond wire are isolated from the semiconductor die by a separation distance.

7. The current sensor of claim 6, wherein the separation distance is at least 100 micrometers.

8. The current sensor of claim 1, wherein non-stitched portions of the at least one bond wire form a loop and are isolated from an edge of the semiconductor die by a vertical separation distance.

9. The current sensor of claim 1, wherein the at least one sensor element is arranged proximate the longitudinal portion of the at least one bond wire stitched to the at least one anchor pad.

10. The current sensor of claim 9, further comprising a plurality of sensor elements, a first portion of the plurality of sensor elements arranged on a first side of the at least one bond wire and a second portion of the plurality of sensor elements arranged on a second side of the at least one bond wire.

11. The current sensor of claim 10, wherein the first portion of the plurality of sensor elements and the second portion of the plurality of sensor elements are arranged according to the following, in order to sense a maximum magnetic field in the at least one bond wire:

$$s = d + 2*d_{iso},$$

where s is a lateral separation distance between the first and second portions of the plurality of sensor elements, d is a diameter of the at least one bond wire and $d_{iso}$ is a separation distance between the at least one bond wire and a plane of the plurality of sensor elements.

12. The current sensor of claim 1, wherein the at least one sensor element comprises a Hall effect element.

13. The current sensor of claim 1, comprising two anchor plates spaced apart and galvanically isolated from each other, wherein a first longitudinal portion of the at least one bond wire is stitched to a first one of the two anchor plates and a second longitudinal portion of the at least one bond wire is stitched to a second one of the two anchor plates.

14. The current sensor of claim 13, wherein the first and second longitudinal portions of the at least one bond wire are substantially parallel to one another.

15. The current sensor of claim 13, wherein the first and second longitudinal portions of the at least one bond wire are substantially linearly arranged with respect to one another.

16. The current sensor of claim 15, wherein the at least one sensor element is arranged proximate an unstitched portion of the at least one bond wire between the first and second longitudinal portions.

17. The current sensor of claim 13, wherein the first and second longitudinal portions are substantially parallel to each other, and wherein a current flow direction in the first longitudinal portion is opposite a current flow direction in the second longitudinal portion.

18. The current sensor of claim 1, wherein the current input and current output are selected from the group consisting of a pin, a pad, a lead, a ball, a land and a leadframe conductor.

19. The current sensor of claim 1, wherein the at least one bond wire is selected from the group consisting of a round wire and a tape wire.

20. The current sensor of claim 1, wherein the at least one anchor pad is separated from an edge of the isolation layer.

21. The current sensor of claim 1, further comprising a signal pin, wherein the signal pin is arranged on a side of the sensor separate from the current input and the current output.

22. The current sensor of claim 21, wherein the current input and the current output are arranged on opposing sides.

23. The current sensor of claim 1, comprising three bond wires and two anchor pads, a first bond wire coupled to the current input and the current output, a longitudinal portion of the first bond wire disposed between the current input and the current output being stitched to at least one of the two anchor pads, a second bond wire disposed between the current input and a first of the two anchor pads, and a third bond wire disposed between the current output and the second of the two anchor pads.

24. The current sensor of claim 23, wherein the two anchor pads are substantially L-shaped.

25. A method comprising:
providing a magnetic field current sensor having at least one bond wire coupled at a stitch between a current input and a current output to at least one anchor pad, wherein the current input, the current output, the at least one bond wire and the at least one anchor pad are galvanically isolated from a die, and at least one sensor element is arranged proximate the stitch to sense a magnetic field induced by current flow in the at least one bond wire.

26. The method of claim 25, further comprising:
inducing the current flow in the at least one bond wire; and
measuring the magnetic field induced by the current flow by the at least one sensor element.

27. The method of claim 25, wherein providing further comprises stitching the at least one bond wire to the at least one anchor pad using a technique selected from the group consisting of direct copper bonding, ball bonding, wedge bonding and nail head bonding.

28. The method of claim 25, wherein providing further comprises isolating the at least one bond wire from the die by at least one of an isolation layer or a physical separation.

29. A current sensor comprising:
a semiconductor die;
an isolation layer disposed on the semiconductor die;
at least one anchor pad disposed on the isolation layer;
a current input and a current output galvanically isolated from the semiconductor die;
at least one bond strip coupled to the current input and the current output, a portion of the at least one bond strip disposed between the current input and the current output being coupled to the at least one anchor pad; and
at least one sensor element arranged to sense a magnetic field induced by a current flowing in the at least one bond strip.

30. A current sensor comprising:
a semiconductor die;
an isolation layer disposed on the semiconductor die;
a plurality of anchor pads disposed on the isolation layer;
a leadframe conductor galvanically isolated from the semiconductor die and comprising a current output portion and first and second current input portions;
a first bond wire coupled to the first current input portion and the current output portion, a portion of the first bond wire between the first current input portion and the current output portion being coupled to a first of the plurality of anchor pads;
a second bond wire coupled to the second current input portion and the current output portion, a portion of the second bond wire between the second current input portion and the current output portion being coupled to a second of the plurality of anchor pads; and
a plurality of sensor elements arranged to sense magnetic fields induced by current flowing in the first and second bond wires.

31. The current sensor of claim 30, wherein the current output comprises first and second current output portions, the first bond wire being coupled to the first current output portion and the second bond wire being coupled to the second current output portion.

* * * * *